United States Patent

Dellantonio

[11] 4,120,207
[45] Oct. 17, 1978

[54] KEYBOARD FOR THE PRESELECTION OF ELECTROMAGNETIC SIGNALS

[75] Inventor: Ezio F. Dellantonio, Rome, Italy

[73] Assignee: Autovox S.p.A., Rome, Italy

[21] Appl. No.: 731,331

[22] Filed: Oct. 12, 1976

[51] Int. Cl.² .......................... F16H 35/18; H03J 5/08
[52] U.S. Cl. .................................................. 74/10.33
[58] Field of Search ................ 74/10.27, 10.31, 10.33, 74/10.35, 10.37, 10.9; 334/7

[56] References Cited

U.S. PATENT DOCUMENTS

| | | | |
|---|---|---|---|
| 2,863,043 | 12/1958 | Schmidt et al. | 74/10.33 |
| 2,898,767 | 8/1959 | Teaf | 74/10.33 |
| 3,602,051 | 8/1971 | Olah | 74/10.35 |
| 3,657,932 | 4/1972 | Walsh | 74/10.33 |
| 3,863,509 | 2/1975 | Zimatore et al. | 74/10.33 |
| 4,030,052 | 6/1977 | Pelletier | 74/10.33 X |

FOREIGN PATENT DOCUMENTS

| | | | |
|---|---|---|---|
| 2,207,032 | 8/1973 | Fed. Rep. of Germany | 334/7 |
| 4,616,762 | 5/1971 | Japan | 74/10.33 |

*Primary Examiner*—Carlton R. Croyle
*Assistant Examiner*—Leonard E. Smith
*Attorney, Agent, or Firm*—James W. Gillman; Donald J. Lisa; Phillip H. Melamed

[57] ABSTRACT

A pushbutton tuner is disclosed in which each pushbutton key can exert an equal force against a slidable tuning element in response to actuation of the key. A link means engages each key during actuation of the key and fixedly positions the key with respect to the tuner frame while a locked adjustable element on the fixed key contacts the slidable tuning element through an elbow lever to position the tuning element.

10 Claims, 4 Drawing Figures

KEYBOARD FOR THE PRESELECTION OF ELECTROMAGNETIC SIGNALS

This invention relates to a keyboard for tuning preselection of electromagnetic signals, particularly adapted for use in car radios and radio receivers for motorcars.

The present keyboard, as well as the conventional ones, are all intended to store, during presetting operation, various positions of a moving tuning system, each at a given key, and during resetting operation, by acting on the respective keys, to move said moving tuning system into the several positions previously set.

In the present keyboard the keys can assume two positions: first, a rest or inoperative position; and second, an operative position or a position called resetting position of tuning to a previously tuned in transmitter, corresponding to the key pushed in till the end of its stroke. Thus, when the keys are all in said inoperative position, a manual knob tuning mechanism becomes operative. In order to preset the keys, first the storing element is released and, second this element is positioned with respect to the key and then locked in the set position.

In the known keyboards, the key is geared with the moving tuning system by means of a gearing force of varying magnitude. By changing such force the points of coupling could be varied, either for deflections experienced by the elements, or for the different position that said elements may assume with respect to the frame. Therefore, an object of this invention is to provide an improved keyboard which overcomes the above mentioned drawbacks, wherein during key presetting operations, the relative coupling between the key and moving element of the tuning system takes place, with a clutch means for said manual tuning knob being engaged, after that said key has been properly positioned with respect to the frame, and the moving storing element of the key, whose position is to be stored, abuts against the moving element of the tuning system with a continuously equal force; thereby avoiding that variations be introduced into the kinematic system during presetting operation. On the other hand, during resetting operation, the key is set with respect to the frame, into the same position that it has assumed during presetting operation, and the moving element of tuning system abuts against the storing element of the key with a continuously equal force, thus avoiding that alterations, with respect to the stored information, be introduced.

Thus, by means of the present device an unexpected accuracy of control is obtained, by referring the key, either during presetting or resetting operations, to a single stroke end stop. Control maintaining is left to the key which remains in the operative position, with the clutch means being disengaged, and no control is transferred to any other means. The resetting operation of another key is that which will enable the return of any operative key to the rest position.

A particular characteristic of the present keyboard is also represented by that the height dimensions thereof are reduced to a minimum.

The keyboard according to this invention essentially comprises a tuning slider, longitudinally reciprocating with respect to the frame, said tuning slider coacting with the tuning system and being formed with a number of slots; a number of elbow levers pivoted on the frame, each having a one arm coacting with a one slot of the tuning slider; and adjustable means engaging the other arm of each of said elbow levers, provided in each of said keys, the keys being guided on the frame at right angles to the tuning slider, and reciprocable between an extracted rest position and a retracted operative position, in which operative position the adjustable means imparts a selected rotation to the corresponding elbow lever, and thereby selectively longitudinally moving said tuning slider.

More specifically, the keyboard of this invention consists of a housing formed from a frame or a base plate provided with flanges and a cover plate, as well as means arranged to displace, in a sliding guided manner, a number of keys; a tuning slider, or bolt, provided with guide means, spring means for backlash take up at guides and adapted to provide a longitudinal component of force for a preferred sliding direction, as well as connecting means with a terminal element of a usual manual knob tuning mechanism, a number of slots being cut into said bolt, each engaging an arm of an elbow lever pivoted on the base plate, while the other arm of each elbow lever is engaged by the respective key; a link for key positioning on which a number of rollers is pivoted, each roller corresponding to a respective key, said link being provided with guide means and spring means tending to continuously urge it in a longitudinal direction, as well as means connected with the manual knob tuning mechanism, whereby by acting on this means the link is displaced in a direction opposite to the direction of action of said means, thereby allowing that any key which may be in the operative position, through the action of a suitable spring means, returns back to the rest position; and a slider controlling the unlocking operation of a suitable clutch means of the manual tuning mechanism provided with guide means and spring means adapted to urge it continuously in a longitudinal direction, as well as a coupling means with said clutch means, each key being provided with an end stroke stop means adapted to position it univocally with respect to the housing, and having the end, which is intended to engage the corresponding elbow lever reciprocally movable and constantly urged by a spring means to the maximum extension position, and being also provided with suitable means to hold said moving end in a given position determined by the position of the corresponding elbow lever, coinciding with the selected transmitting station tuning, the relative coupling between the key and the corresponding elbow lever, and therefore with the bolt being effectuated with a constantly equal force provided by the spring means acting on said bolt.

This invention will be better illustrated hereinafter by means of an embodiment thereof, by way of example only, with reference to the accompanying drawings. In the drawings.

Figure 1:
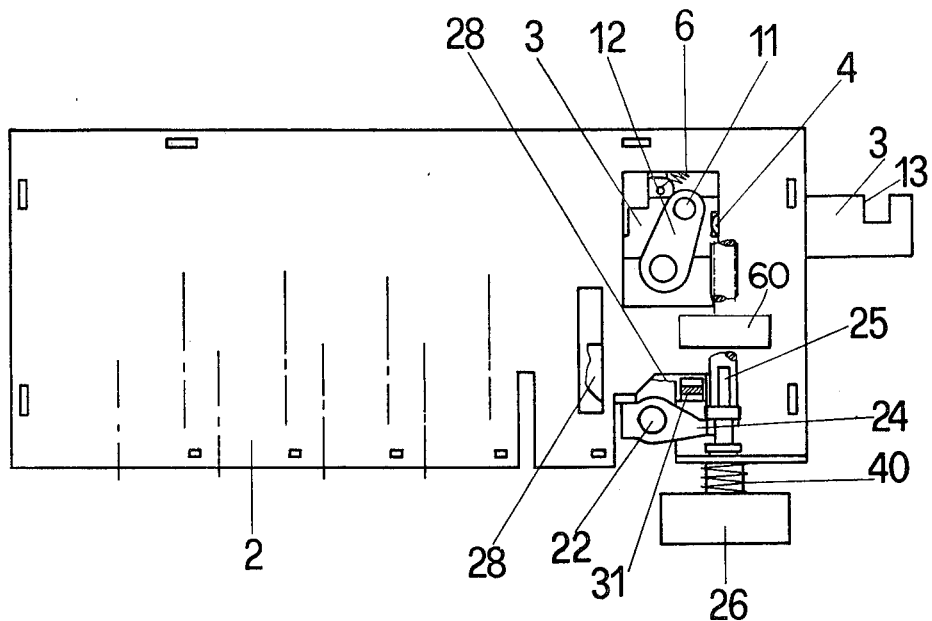
FIG. 1 is a top view, with parts of the cover plate broken away, of the keyboard according to this invention.

Referring to the drawings, a frame or a base plate 1, of essentially rectangular form, is provided with flanges on its four sides and with a cover plate 2.

On the inner surface of base plate 1 there is disposed a tuning slider or bolt 3 which consists of an elongate thin element guided by pins 4 fixed on base plate 1, and cooperating with slots 5 formed in bolt 3.

Figure 2:
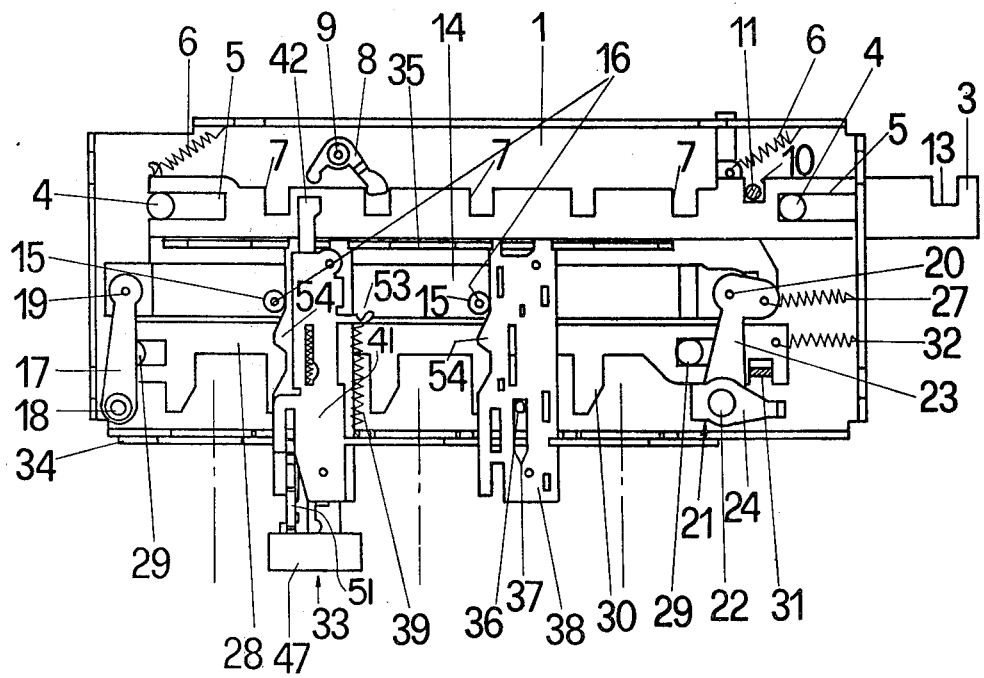
FIG. 2 is a schematic top view of the present keyboard, with the cover plate and some keys being removed for the sake of clarity.

Bolt 3 is biased by means of two springs 6 arranged so as to take up any backlash at the guide means, and to provide a longitudinal component of bias in a preferred direction of sliding. On one of the long sides of the bolt 3 a number of slots 7 is cut, five in the present example, in each of which there is housed the arm end of a respective elbow lever 8, which consists of an element substantially V-shaped, rotatable about a pin 9 secured to the base plate 1. Within a recess 10 of the bolt 3 there is accomodated a pin 11 integral with a crank 12 fixed to a usual manual knob tuning mechanism which establishes a knob tuning input control, while the output of the keyboard control is at a slot 13 cut into the outer end of bolt 3 (on the right hand as seen in FIGS. 1 and 2). Parallel, and adjacent to the bolt 3 there is arranged, on the base plate 1, a link 14 for key positioning, which link consists of a long thin element carrying rollers 15 each corresponding to the relative key, each roller 15 being rotatable about a pin 16 integral with said link 14. Link 14, which is slidable in a longitudinal direction, at one end thereof is guided by a crank 17 having its ends pivoted in 18 and 19 to frame 1 and link 14 respectively. The other end of link 14 is connected, by a pin 20 to a bridge 21 pivoted in 22 to the base plate 1. The bridge 21 is formed of an element having two arms 23, 24 substantially perpendicular to each other, lying in different planes. The free end of arm 23 is pivoted in 20 to the key positioning link 14, while the free end of the other arm 24 extends to the proximity of a spindle 25 of a manual tuning control knob 26. Link 14 means of a spring 27 is constantly biased into a preferred longitudinal direction, particularly to the right, as seen in FIG. 2 of the drawings.

Parallel, and adjacent to link 14 there is positioned an unlocking slider 28, which acts as a control for disengaging a standard clutch means 60 for the usual manual tuning mechanism, which slider 28 consists of an elongate flat element guided by two pins 29, fastened to base plate 1. The slider 28 has an essentially saw-tooth like configuration, with each tooth 30 being arranged with respect to a corresponding key. A one end of the slider 28 is connected at 31, through a leverage (not shown), to said clutch means. The slider 28 is constantly biased, by means of a spring 32, in a preferred longitudinal direction, particularly to the right, as seen in FIG. 2 of the drawings.

On the flange of one of the long sides of base plate 1 there is provided a number of through openings, five in the present example, for introducing therein an equivalent number of keys 33, whose structure will be described in detail later. Each key 33 is guided in its reciprocating sliding movement by a corresponding slot on a brace 34, fixed by screws, or the like, to the outer surface of key introducing flange of base plate 1; by a second slot, aligned with the former slot, formed in an internal upright flange 35 of the base plate 1; and by a pin 36 which is integral with the surface of base plate 1 and slidable within a slot 37 in a key slide 38. Pin 36 also acts as a stop abutment for key inserting movement. A spring 39 will permit the self-returning of key 33 to the rest position.

On the cover plate 2 the manual tuning controlling device is mounted, operated by knob 26. This device is of a conventional construction, and thus is not described. The manual tuning device, as already mentioned, acts, by means of the pin 11 of the crank 12, on the tuning slider 3. The spindle 25 of knob 26 is axially movable so as to control, through inward axial movement, the bridge 21 that displaces link 14, allowing keys 33 to return to rest position. The spindle 25, upon being pushed inward, through the free end thereof, coacts with a known leverage (not shown) to lock the clutch means, whereby the position of said tuning system remains unchanged. A spring 40 urges spindle 25 and knob 26 towards the extracted external position.

Figure 3:
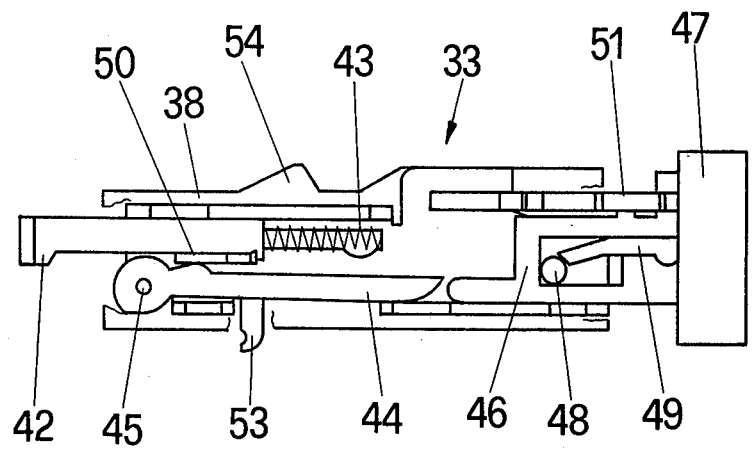
FIG. 3 is a top view, with parts broken away, of a key.
Figure 4:
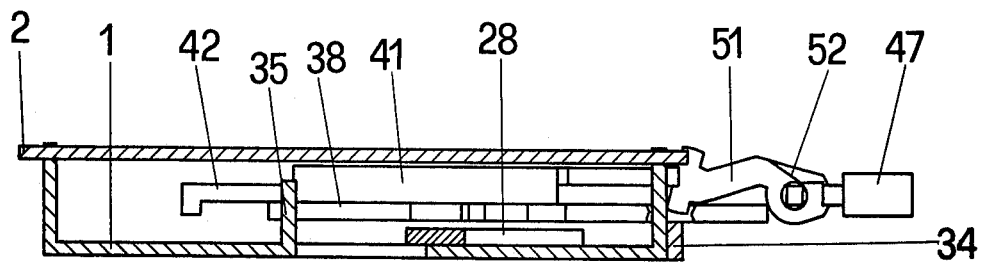
FIG. 4 is a cross sectional view, with parts broken away, of the keyboard according to the invention.

The key 33, according to this invention (see FIGS. 3 and 4), includes a casing 41 in which there are arranged an adjustable means in the form of a small reciporocating piston 42 and continuously biased by a spring 43 to its maximum extended position; a clamping lever 44 fulcrumed in 45; an extractable body 46 provided with a cap 47 at one end thereof, and comprised of a hollow thin element essentially rectangular, with one of the longer sides projecting towards the free end of the clamping lever 44, said extractable body 46 being guided by pin 48 integral with casing 41 and by a small leaf-spring 49 confined within the internal space of said extractable body 46; a platelet 50 for locking the small piston 42, having an essentially cross-like configuration and positioned in the direction of thickness between the small piston 42 and the clamping lever 44, with one arm inserted in a slot of the casing 41, and the other arm inserted in a relative slot of the slide 38 formed of a plate which closes the casing 41.

On, and adjacent to one side of the extractable body 46 there is mounted a platelet 51 continuously biased by a spring 52 against the slide 38. The special shape of platelet 51, acting on the slide 38, causes said platelet to assume two different angular positions, produced by the movement of the extractable body 46. With the extractable body in its retracted position, the platelet 51 assumes a first position, in which it coacts with the corresponding tooth 30 of the slider 28 when the key is pushed in towards its operative position. Conversely, when the extractable body 47 is in its second position, platelet 51 is out of engagement with respect to the slider.

Laterally to the casing 41 there is provided a hooklike projection 53 to engage one end of the key return spring 39, the other end of spring 39 being secured to the front flange of base plate 1.

OPERATION (1) Key disabling: pushing spindle 25 inwardly, by means of knob 26 of the manual tuning mechanism, there is produced an angular displacement of the free end of arm 24, adjacent to the spindle 25 of said bridge 21 which rotates about fulcrum 22, thereby causing a rotational movement of the arm 23 of bridge 21 pivoted in 20 to link 14 and constraining the latter so as to move in a direction opposite to the action of spring 27, whereby driving rollers 15 out of engagement with an eared cam 54 of the key slide 38, whereby any one key previously inserted into the operative position springs into the rest position by action of the spring 39.

Upon releasing knob 26, the spring 40 will return said knob back to the starting position, whereas spring 27, acting on the link 14, will return both said link 14 and bridge 21 back to the original position.

(2) Key presetting: provided that keys have been disabled, body 46 of a selected key to be presetted, is extracted. By turning knob 26, through the manual tuning mechanism, crank 12 is acted upon, and the latter with its pin 11 drives tuning slider 3 towards the desired position to which corresponds a well determined position of elbow lever 8 (relative to the selected key). During presetting operation and when the key body 46 is extraced, the small piston 42 of key 33 is still free to slide inasmuch as the small leaf-spring 49 has not permitted the extractable body 46 to reach and engage the clamping lever 44. Such sliding capability causes small piston 42, which is urged by spring 43 into abutment against the corresponding elbow lever 8, to assume the position dictated by said elbow lever 8 which, being not able to rotate, inasmuch as directly controlled by the manual tuning mechanism, makes the small piston 42 to slide along the guiding means thereof. At this point, by completely pushing in the key, the stroke limit stop position is reached, with pin 36 on base plate 1 seated on the V-end of the slot 37 of slide 38 which is held in its operative position by the corresponding roller 15 of the link 14 engaged within the internal space of the eared cam 54 of said slide 38. In such case the desired tuning position is obtained, with backlash take-up at the kinematic system. In order to realize the storing operation, the previously extracted key body 46 is pushed in, through cap 47, so as to insert it, whereby overcoming the resistance of the small leaf-spring 49; the extended side of body 46 laterally displaces the rounded end of the clamping lever 44, rotating it about pin 45 in such a manner that, by means of platelet 50 it blocks in position the small piston 42. Moreover, the clamping stroke of the extractable body 46, causes platelet 51, by the action of spring 51, to rotate towards such a position that coacts with the relative tooth 30 on slider 28 of the manual tuning mechanism.

(3) Key resetting: by pushing a key during resetting operation, the displacement of the slider 28 is effectuated by means of platelet 51 which, as described hereinbefore, has been brought to a position in order to coact with said slider 28 during the presetting operation. Such displacement of slider 28 unlocks the clutch means of the manual tuning mechanism, whereby bolt 3 is free to move under to action of spring 6 in the preferred direction. The small piston 42, which now is locked to the key slide 38, rotates the relative elbow lever 8 which moves the tuning slider 3 into the stored position. Such position is held by the bistable system until resetting of another key, or upon disabling.

What is claimed is:

1. In a keyboard for the preselection of electromagnetic signals, wherein a frame carries a tuning system operated by a manual knob operated tuning mechanism provided with a disengageable clutch means and by a number of pushbutton keys each having stored thereon a position to be imparted to the tuning system, the improvement comprising: a tuning slider longitudinally reciprocal with respect to the frame, wherein said tuning slider is declutchably coupled to said manual knob mechanism and coacts with the tuning system by selecting different predetermined signals corresponding to each longitudinal position of said tuning slider; a number of levers pivoted on the frame, each lever having one end coacting with the tuning slider; and adjustable means engaging the other end of each of said levers and provided on each of said keys, the keys being guided on the frame at right angles to the tuning slider, said keys being also reciprocal between an extracted rest position and a retracted operative position, in which operative position the adjustable means imparts a selected rotation to the corresponding lever and thereby implements a selected longitudinal movement to said tuning slider, the improvement further comprising:

a link reciprocal on the frame parallel to said tuning slider; a number of elements projecting from said link; an eared cam on each key; and spring means urging said link towards a position wherein one of the projecting elements engages the eared cam of the corresponding key pushed into the operative position, to lock it in that position.

2. A keyboard according to claim 1, further comprising: a bridge pivoted on the frame and having two arms, one arm being articulated to the link and the other arm cooperating with a knob spindle of the manual tuning mechanism when the knob is pushed inwardly to move said link against its spring means to release any keys locked in the operative position by said link.

3. A keyboard according to claim 1 wherein said tuning slider is provided with a number of slots and wherein said levers comprise elbow levers having said one end of each of said levers coact with one of said slots and said other end of each of said levers engage said adjustable means on each of said keys.

4. In a keyboard for the preselection of electromagnetic signals, wherein a frame carries a tuning system operated by a manual knob operated tuning mechanism provided with a disengageable clutch means and a number of pushbutton keys each having stored thereon a position to be imparted to the tuning system, the improvement comprising: a tuning slider longitudinally reciprocal with respect to the frame, wherein said tuning slider coacts with the tuning system by selecting different predetermined signals corresponding to each longitudinal position of said tuning slider, a number of levers pivoted on the frame, each lever having one and coacting with the tuning slider; and adjustable means engaging the other end of each of said levers and provided on each of said keys, the keys being guided on the frame at right angles to the tuning slider, said keys being also reciprocal between an extracted rest position and a retracted operative position, in which operative position the adjustable means imparts a selected rotation to the corresponding lever and thereby implements a selected longitudinal movement to said tuning slider, the improvement further comprising said key having a key slide with guide means cooperating with complimentary guide means of the frame for linear reciprocating movement of said key slide at right angles to the tuning slider, said adjustable means being slidable on the key slide; an extractable body movable from a retracted position to an extracted position with respect to the key slide; locking means holding said adjustable means in a selected position when the extractable body is in its retracted position and releasing said slidable adjustable means for movement when said extractable body is in its extracted position; and spring means urging said slidable adjustable means towards said other end of the respective lever.

5. A keyboard according to claim 4 wherein said locking means comprises: a clamping lever fulcrumed to said key slide and engageable by said extractable body; said clamping lever being pivoted and locking said adjustable means when said clamping lever is engaged by the extractable body.

6. A keyboard according to claim 4, further comprising: a leaf-spring bistable guide means on the key slide for the extractable body for resiliently maintaining the extractable body in the retracted and extracted position thereof, said bistable means comprising a leaf spring element coacting with a pin.

7. A keyboard according to claim 4, further comprising: a saw-toothed unlocking slider reciprocal on the frame parallel to said tuning slider and linked to said disengageable clutch means of said manual knob tuning mechanism, said unlocking slider having a one tooth for each key; and a platelet pivoted on said extractable body of the key and engaging the respective tooth when the extractable body is in its retracted position and the key is pushed towards its retracted operative position.

8. A keyboard according to claim 4, wherein said guide means for the key slide comprises a pin integral with the frame; a slot in the key slide coacting with the pin and having a V-end in which the pin seats in the retracted operative position of the key.

9. A keyboard according to claim 4 further comprising backlash take-up spring means having one end coupled to the frame and the other end coupled to the tuning slider, the spring means axis forming an angle to the tuning slider, whereby said means urges the tuning slider with a force having two components, a first component being in a longitudinal direction, in which said other ends of said levers tend to engage said adjustable means, and a second component in a transversal direction, in which said spring means takes-up any backlash of the tuning slider.

10. A keyboard according to claim 4 wherein said tuning slider is provided with a number of slots and wherein said levers comprise elbow levers having said one end of each of said levers coact with one of said slots and said other end of each of said levers engage said adjustable means on each of said keys.

* * * * *